United States Patent
Taylor

(10) Patent No.: US 7,288,962 B2
(45) Date of Patent: Oct. 30, 2007

(54) LEVEL SHIFTING MULTIPLEXING CIRCUIT FOR CONNECTING A TWO CONDUCTOR FULL DUPLEX BUS TO A BIDIRECTIONAL SINGLE CONDUCTOR BUS

(75) Inventor: John Philip Taylor, San Diego, CA (US)

(73) Assignee: Kyocera Wireless Corp., San Diego, CA (US)

( * ) Notice: Subject to any disclaimer, the term of this patent is extended or adjusted under 35 U.S.C. 154(b) by 60 days.

(21) Appl. No.: 11/350,597

(22) Filed: Feb. 8, 2006

(65) Prior Publication Data
US 2007/0182449 A1 Aug. 9, 2007

(51) Int. Cl.
H03K 19/094 (2006.01)
H03K 19/0175 (2006.01)
H04B 1/38 (2006.01)

(52) U.S. Cl. .............. 326/68; 326/81; 326/86; 375/220

(58) Field of Classification Search .......... 326/63, 326/68, 80, 81, 82, 83, 86; 375/220; 710/305
See application file for complete search history.

(56) References Cited

U.S. PATENT DOCUMENTS

| | | | | |
|---|---|---|---|---|
| 5,243,623 | A | * | 9/1993 | Murdock ............ 375/220 |
| 5,646,552 | A | | 7/1997 | Ota |
| 5,715,409 | A | * | 2/1998 | Bucher et al. ........ 710/62 |
| 5,838,471 | A | * | 11/1998 | Beard ............... 398/136 |
| 5,862,254 | A | | 1/1999 | Curiger et al. |
| 5,872,471 | A | | 2/1999 | Ishibashi et al. |
| 6,184,737 | B1 | | 2/2001 | Taguchi |
| 2001/0034246 | A1 | | 10/2001 | Hutchinson et al. |
| 2004/0208200 | A1 | | 10/2004 | Hejdeman et al. |

FOREIGN PATENT DOCUMENTS

EP 1 050 824 A2 11/2000
GB 2 349 286 A 10/2000

OTHER PUBLICATIONS

Takahashi, et al., "3.3V-5V Compatible I/O Circuit without Thick Gate Oxide", Proceedings of the Custom Integrated Circuits Conference. May 3, 1992, IEEE, NY vol. Conf. 14.

* cited by examiner

Primary Examiner—Daniel Chang

(57) ABSTRACT

A level shifting multiplexing circuit provides an interface between a two conductor full duplex bus (two conductor bus) and a single conductor bidirectional half duplex bus (single conductor bus) where the two conductor bus is operates at a first supply voltage and the single conductor bus operates at a second supply voltage. A first switching circuit connected between the single conductor bus and the reception conductor of the two conductor bus is configured to provide a low logic signal to the reception conductor when a first switching voltage threshold is exceeded and to provide a high logic signal, otherwise. A second switching circuit connected between the single conductor bus and the transmission conductor of the two conductor bus is configured to provide a voltage less than the first switching voltage threshold when voltage at the transmission conductor exceeds a second switching voltage threshold unless a high logic signal is received on the single conductor bus. The second switching circuit is further configured to provide a voltage greater than the first switching voltage when the transmission conductor voltage exceeds the second switching voltage threshold unless a low logic signal is received on the single conductor bus.

19 Claims, 2 Drawing Sheets

LEVEL SHIFTING MULTIPLEXING CIRCUIT FOR CONNECTING A TWO CONDUCTOR FULL DUPLEX BUS TO A BIDIRECTIONAL SINGLE CONDUCTOR BUS

FIELD OF THE INVENTION

The invention relates in general to wireless communication systems and more specifically to a level shifting multiplexing circuit for connecting a two conductor full duplex bus to a bidirectional single conductor bus.

BACKGROUND OF THE INVENTION

Processors exchange data over a bus to communicate with other devices and other processors. A typical arrangement includes a two wire device utilizing a universal asynchronous receiver/transmitter (UART) to communicate with one or more devices such as slave processors. A bus allows multiple devices to communicate over one or more conductors such as wires. Due to design limitations related to size, supply power, and other factors, it is often advantageous to limit the number of pins on packaged electronic devices, wires, and other conductors. A single conductor bus allows for fewer pins and conductors as compared to multiple conductor buses. Conventional designs utilizing single conductor buses, however, are limited in that the devices connected to the single conductor bus must operate at the same voltage as the devices communicating on the two conductor bus.

Accordingly, there is need for a level shifting multiplexing circuit for connecting a two conductor full duplex bus to a bidirectional single conductor bus.

SUMMARY OF THE INVENTION

A level shifting multiplexing circuit provides an interface between a two conductor full duplex bus (two conductor bus) and a single conductor bidirectional half duplex bus (single conductor bus) where the two conductor bus operates at a first supply voltage and the single conductor bus operates at a second supply voltage. A first switching circuit connected between the single conductor bus and the reception conductor of the two conductor bus is configured to provide a low logic signal to the reception conductor when a first switching voltage threshold is exceeded and to provide a high logic signal, otherwise. A second switching circuit connected between the single conductor bus and the transmission conductor of the two conductor bus is configured to provide a voltage less than the first switching voltage threshold when voltage at the transmission conductor exceeds a second switching voltage threshold unless a high logic signal is received on the single conductor bus. The second switching circuit is further configured to provide a voltage greater than the first switching voltage when the transmission conductor voltage exceeds the second switching voltage threshold unless a low logic signal is received on the single conductor bus.

DETAILED DESCRIPTION

Figure 1:
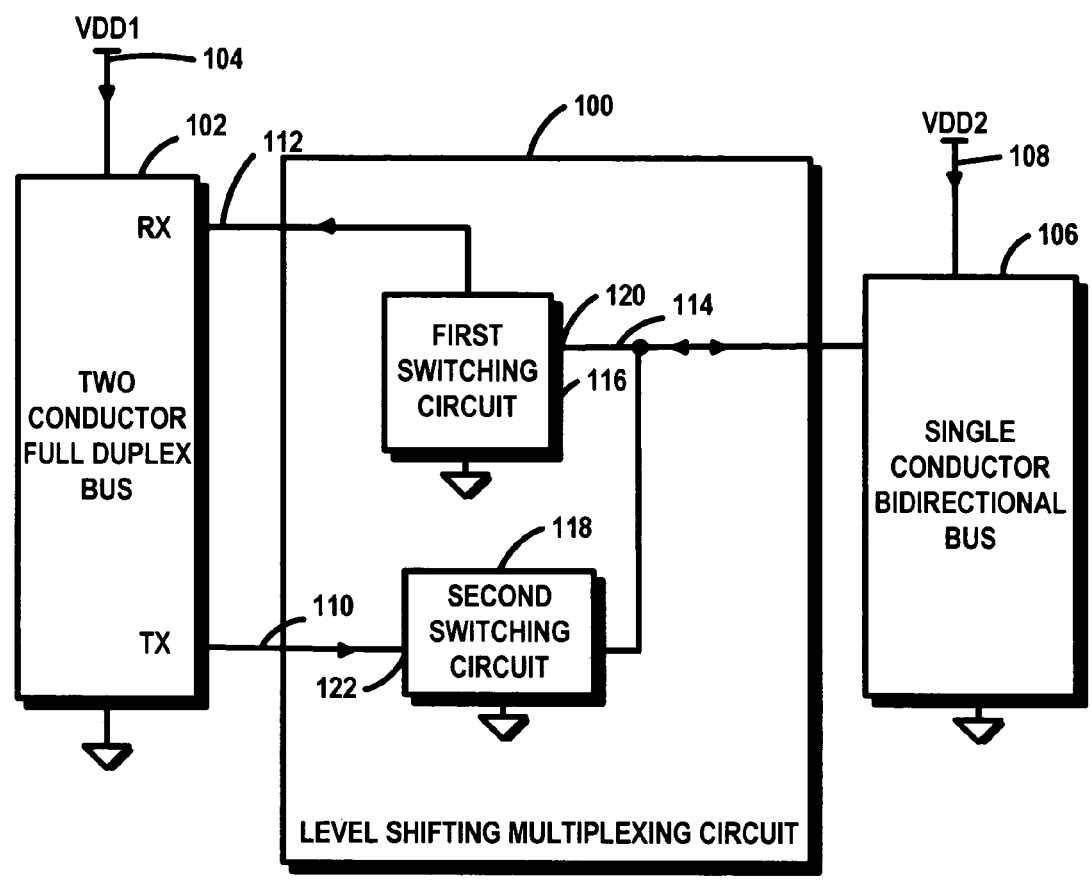
FIG. 1 is a block diagram of a level shifting multiplexing circuit in accordance with an exemplary embodiment of the invention.

FIG. 1 is a block diagram of a level shifting multiplexing circuit connected between a two conductor full duplex bus 102 and a single conductor bidirectional bus 106 in accordance with the exemplary embodiment of the invention. The functions and operations of the blocks described in FIG. 1 may be implemented in any number of devices, circuits, or elements. Two or more of the functional blocks may be integrated in a single device and the functions described as performed in any single device may be implemented over several devices. The switching circuits include N-Channel Metal Oxide Semiconductor Field Effect Transistors (MOSFETS) and resistors in the exemplary embodiment. Although the switching circuits are represented by two blocks within the level shifting multiplexing circuit 100 in FIG. 1, some of the components of the switching circuits 116, 118 described as part of the switching circuits 116, 118 may be implemented as part of devices connected to the one of the buses 102, 106. As explained below, for example, a resistor of the second switching circuit 118 is implemented as part of a single bus device connected to the single conductor bus 106 in the exemplary embodiment.

The level shifting multiplexing circuit 100 multiplexes signals from a two conductor full duplex bus (two conductor bus) 102 referenced to a first supply voltage (VDD1) of a first supply 104 to a single conductor bidirectional bus (single conductor bus) 106 referenced to a second supply voltage (VDD2) of a second supply 108. Devices connected to the two conductor bus 102 transmit data on a transmission (TX) conductor 110 and receive data on a reception (RX) conductor 112. Devices connected to the single conductor bus 106 transmit and receive data on a single conductor 114. The devices communicating on the two conductor bus 102 are connected to the first supply 104. Accordingly, the signals on the two conductor bus vary between a low voltage at or near ground potential and a high voltage at or near the first supply voltage of the first supply 104. The devices communicating on the single conductor bus 106 are connected to the second supply 108. The signals on the single conductor 114 vary between a low voltage at or near ground potential and a high voltage at or near the second supply voltage of the second supply 108.

The level shifting multiplexing circuit 100 includes a first switching circuit 116 and a second switching circuit 118 to establish and present data on the reception conductor 112 and the single conductor 114 in accordance with data on the transmission conductor 110 and data transmitted by a single bus device (not shown in FIG. 1) communicating on the single conductor bus 106. The switching circuits 116, 118 are further configured to present the TX data on the single conductor bus 106 and the reception bus 112 unless data is transmitted by a single bus device communicating on the single conductor bus 106. Data transmitted by a single conductor device communicating on the single conductor bus 106 is presented at the reception conductor 112. Accordingly, data transmitted by a single bus device communicating on the single conductor bus 106 overrides data transmitted on the transmission conductor 110 to present the single bus data to the reception conductor 112. As explained in further detail below, data on reception conductor 112 is inverted relative to the data on the single conductor bus 106 and data transmitted by on the transmission conductor 110 is inverted on the single conductor bus 106 in the exemplary embodiment. Therefore, single conductor devices transmit and receive inverse polarity data in the exemplary embodiment.

When the voltage at a gate 120 of the first switching circuit 116 exceeds a first switching voltage threshold, the first switching circuit 116 is activated and conducts current. When the voltage at a gate 122 of the second switching circuit 118 exceeds a second switching voltage threshold, the second switching circuit 118 is activated and conducts current. Little or no current flows through the devices if the thresholds are not exceeded.

When no data is transmitted by devices communicating on the single conductor bus 106, the single conductor bus 106 has a high impedance value. In this state, the devices communicating on the single conductor bus 106 are in the receive state (or sleep state) and data appearing on the transmission conductor 110 is presented at the reception conductor 112. When the voltage on the transmission conductor 110 is greater than the second switching voltage threshold, the second switching circuit 118 is activated to allow current flow through the circuit 118 which results in a low logic level at the input of the first switching circuit 116. As described in further detail below with reference to FIG. 2, the current flow creates a voltage drop across a resistor to lower the voltage of the single conductor bus 106 below a switching voltage threshold of the first switching circuit 116 in the exemplary embodiment. As a result, the first switching circuit 116 is not activated or "turned on" and the reception port 112 remains at a high level. In the exemplary embodiment, a pull-up resistor keeps the voltage at, or near, the first supply voltage.

Continuing with the situation when no data is transmitted by devices communicating on the single conductor bus 106, a high logic voltage is presented on the single conductor bus 106 when a low logic voltage is presented on the transmission conductor 110. When the voltage on the transmission conductor 110 is less than the second switching voltage threshold, the second switching circuit 118 remains in an inactive or "off" state and no current flows. There is no voltage drop across the resistor in the exemplary embodiment and the voltage on the single conductor bus 106 remains at or near the second supply voltage of the second supply 108. As a result, the first switching voltage threshold of the first switching circuit 116 is exceeded and the first switching circuit 116 is placed in an "on" state allowing current flow through the first switching circuit 116. As discussed below in further detail, the current flow results in a voltage drop across the pull-up resistor to present a logic low at the reception conductor 112.

In the exemplary embodiment, devices communicating on the single conductor bus 106 transmit and receive data with inverse polarity. In most situations, the devices can be configured to inverse communication. In some situations additional logic may be required to invert the data. When the devices communicating on the two conductor bus 102 are in an idle state, the transmission conductor 110 has a high logic level and, therefore, has a voltage at or near the first supply voltage. As discussed above, any data transmitted by the devices communicating on the single conductor bus 106 overrides the data on the transmission conductor 110. When the transmission conductor 110 has high logic voltage and a device communicating on the single conductor bus 106 transmits a low logic value, the first switching circuit 116 remains in the off state and the reception conductor 112 has a high logic level. The second switching circuit 118 is configured such that where a device communicating on the single conductor bus 106 transmits a high logic signal, voltage on the single conductor rises above the first switching threshold voltage. As a result the high logic level overrides the low value on the single conductor bus 106 resulting from a high logic level on the transmission conductor 110.

Where the transmission conductor 110 has a low logic level, the single conductor bus 106 remains in a high logic level unless a device communicating on the single conductor bus 106 transmits a low logic signal. The second switching circuit 118 is configured such that where a device communicating on the single conductor bus 106 transmits a low logic signal, the voltage on the single conductor bus 106 drops below the first switching voltage threshold of the first switching circuit 116 even when the transmission conductor 110 has a low logic voltage. As discussed below, a voltage divider formed by resistors in the second switching circuit 118 allows the low voltage on the single conductor 114 to override the otherwise high voltage resulting from the low logic voltage on the transmission conductor 110 in the exemplary embodiment.

Figure 2:
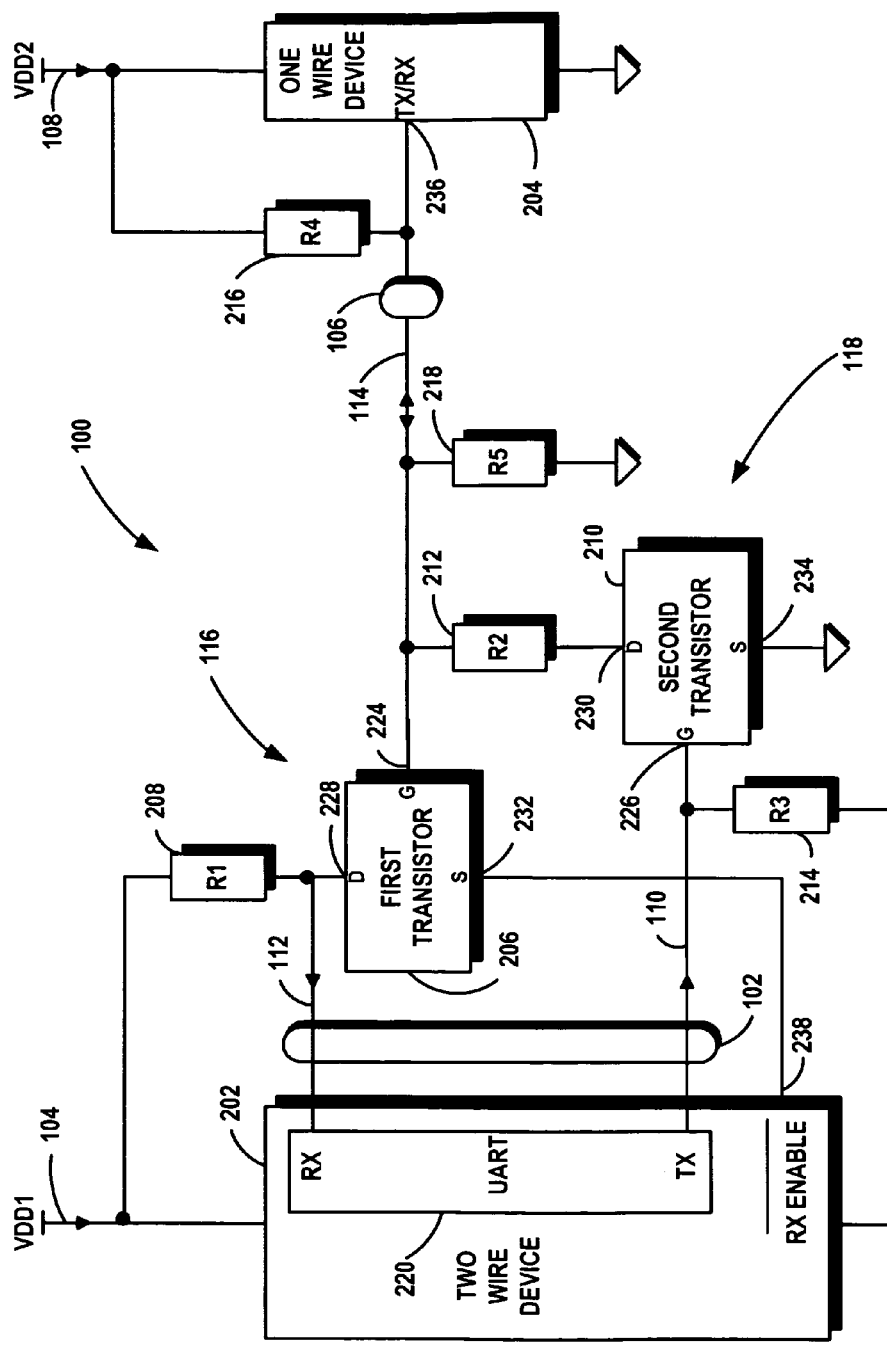
FIG. 2 is a block diagram of the level shifting multiplexing circuit connected between a two wire device and a single wire device in accordance with the exemplary embodiment of the invention.

FIG. 2 is a block diagram of the level shifting multiplexing circuit 100 connected between a two wire device 202 communicating on the two conductor bus 102 and a single wire device 204 communicating on the single conductor bus 106 in accordance with the exemplary embodiment of the invention. The first switching circuit 116 and the second switching circuit 118 can be implemented using any combination of electrical devices to facilitate operation of the switching circuits 116, 118 as described above. In the exemplary embodiment, the switching circuits 116, 118 include field effect transistors (FETs) and resistors where at least some of the components may be discrete devices. Some of all of the devices may be implemented in a single device, however. For example, the components may be implemented as part of an application specific integrated circuit (ASIC). Those skilled in the art will readily apply the following discussion directed to N-Channel FETs to other types of transistors and switching devices such as bipolar junction transistors (BJTs), for example. The following references to the gate, source, and drain of a FET can be respectively correlated to the base, collector and emitter of a BJT.

In the exemplary embodiment, the first switching circuit 116 includes a first transistor 206 and a first resistor 208 and the second switching circuit 118 includes a second transistor 210, a second resistor 212, a third resistor 214, a fourth resistor 216 and a fifth resistor 218. Some of the components may be omitted in some situations and some of the components may be implemented as part of other devices. For example, although the fourth resistor 216 is described as part of the second switching circuit 118, the fourth resistor may be implemented as part of the single wire device 204. Accordingly, where the single wire device 204 includes the fourth resistor 216, the level shifting multiplexing circuit 100 does not include the fourth resistor 216. Although the first resistor 208 and the fourth resistor 216 are illustrated as discrete blocks in FIG. 2, the first resistor 208 and fourth resistor 216 may be implemented as part of two wire device 202 and single wire device 204, respectively, in some circumstances.

The transistors 206, 210 are N-Channel metal-oxide semiconductor field-effect transistors (MOSFETs) although other types of transistors may be used in some circumstances. As discussed above, the transistors 206, 210 may include other types of field effect transistors (FETs), or bipolar junction transistors (BJTs), for example. Further, depending on the voltage references relative to ground the FETs may be P-Channel in some situations. The selection of reference names such as first, second etc. in the following discussion is for reference and explanation purposes only and such naming does not imply any order of operation or relative importance of the components.

During operation, the first and second switching circuits 116, 118 multiplex signals transmitted and received by the two wire device 202 on the two conductor bus 102 with the signals transmitted and received by the single wire device 204 on the single conductor bus 106. Since the two wire device 202 is connected to the first supply 104 and the single wire device 204 is connected to the second supply 108, the switching circuits 116, 118 level-shift the signals to provide an interface between the two conductor bus 102 and the single conductor bus 106. In the example discussed with reference to FIG. 2, a universal asynchronous receiver-transmitter (UART) 220 in the two wire device 202 communicates over the two conductor bus 102.

The first transistor 206 and the second transistor 210 each have a gate 224, 226, a drain 228, 230 and a source 232, 234. If the drain 228, 230 is connected to a positive supply, current flows through the transistor 206, 210 when the voltage at the gate 224, 226 exceeds the switching voltage threshold. Accordingly, the first transistor 206 has a first switching voltage threshold that corresponds to the first switching voltage threshold of the first switching circuit 116 and the second transistor 210 has a second switching voltage threshold that corresponds to the second switching voltage threshold of the second switching circuit 118. In the exemplary embodiment, therefore, the Vgs threshold of the first transistor 206 is the first switching voltage threshold and the Vgs threshold of the second transistor 210 is the second switching voltage threshold. The second transistor 210 is selected such that the maximum allowable voltage at the drain 230 is compatible with the maximum possible voltage of the second supply 108. In the exemplary embodiment, the Vgs thresholds of the transistors 206, 210 are the same although they may be different in some situations.

The drain 228 of the first transistor is connected to the reception conductor 212 and to the first supply 104 through the first resistor 208. The gate 224 is connected to the single conductor bus 106. As described below in further detail, the source 232 is connected to a RX enable output port 238 of the two wire device 202 in the exemplary embodiment to provide control over the connection between the single conductor 114 and the reception conductor 112. In some situations the source 232 may be connected to ground. The drain 230 of the second transistor is connected to the single conductor bus 106 through the second resistor 212. The gate 226 of the second transistor 210 is connected to the transmission conductor 110 and to ground through the third resistor 214. The source 234 is connected to ground. As described herein, the second switching circuit 118 includes the fourth resistor 216 that is connected between the single conductor 114 and the second supply 108 (VDD2) and a fifth resistor 218 connected between the single conductor 114 and ground. In many circumstances, the fourth resistor 216 is located near the single wire device 216 since the second supply 108 is most accessible near the devices communicating on the single conductor bus 106. For example, where the two wire device 202 is a processor operating within a cellular communication device and the single wire device 204 is implemented as part of a detachable battery, the connection between the battery and the cellular device includes a single pin that is the single conductor 114. Accordingly, the fourth resistor 216 is typically more easily connected within the circuitry near the single wire device 204. Since different batteries and devices may operate at different second voltage supplies, the resistor value may be a different value for different single conductor devices. The selected values, however, must be such that when the second transistor 210 is on and the second supply is at its maximum voltage, the division of ratio of the second resistor and the fourth resistor establish a voltage that is sufficiently low to avoid activating the first transistor.

The single wire device 204 is connected to the single conductor bus 106 through a general purpose input output (GPIO) port 236. When the single wire device 204 is in a listen state, the GPIO port 236 is set to an open circuit resulting in a high impedance. During transmission, the GPIO port 236 alternates between a low and high level where the low can be interpreted as a low impedance connection to ground and where the high can be interpreted as a low impedance connection to the second supply 108.

During operation, signals on the transmission conductor 110 switch the gate between high and low levels. The transmission conductor 110 is maintained in the high state when the two wire device 202 is idle. During this state, the second switching voltage threshold is exceeded at the gate 226 and, as a result, the drain 230 of the second transistor is pulled low with the second resistor 212 and the fourth resistor 216 forming a voltage divider. The values of the second resistor 212 and the fourth resistor 216 are selected such that when the second supply 108 has a maximum possible voltage, the voltage at the gate 224 of the first transistor 206 is less than the first switching voltage threshold of the first transistor 206 by a sufficient margin. An example of a suitable ratio of the resistance values of the second resistor 212 and fourth resistor 216 is $\frac{1}{10}$. In the exemplary embodiment, the second resistor 212 has a resistance of 3.3 K Ohms and the fourth resistor 216 has a resistance of 33 K Ohms. When the voltage on the transmission conductor 110 drops below the second switching voltage threshold (Vgs threshold), the second transistor 210 is in the off state, no current flows, and the voltage on the single conductor bus 106 is pulled up to (or near) the second supply voltage. When the voltage on the single conductor bus 106 exceeds the first switching voltage threshold (Vgs) of the first transistor, the first transistor 206 is turned on and the voltage at the drain 224 is pulled low due to voltage drop across the first resistor 208. Accordingly, data on the transmission conductor 110 is received by the UART 220 on the reception conductor 112. The polarity of the data is maintained as a result of the double inversion through the switching circuits 116, 118. In addition to the requirements discussed above, the resistance values of the second resistor 212 and fourth resistor 216 must be adequately low to sufficiently discharge any charge accumulated due to the capacitance appearing on the single conductor bus 106. The capacitance on the single conductor bus 106 includes the capacitance of the second transistor 210. The resistance of the second resistor 212 should be low enough to address falling edges and the resistances of the first resistor 208 and fourth resistor 216 should be low enough to provide for rising edges compatible with the baud rate when applied to the parasitic capacitance of the devices connected to the conductors 112, 114, respectively.

While in the receive mode, the single wire device 204 may use transitions on the single conductor bus 106 to wake up from a sleep mode or read serial data transmitted by the two wire device 202. Known techniques for managing multiple devices on the single conductor bus 106 may be used where more than one single wire device is communicating on the single conductor bus 106. For example, addressing may be applied to the data stream to select a target device from multiple devices on the single conductor bus 106.

The single wire device 204 transmits data by switching the GPIO port 236 between low and high values. The GPIO port 236, therefore, changes from a high impedance in the receive mode to a low impedance in the transmit mode. Data transmitted by the single wire device 204 overrides any data transmitted by the two wire device 202.

Since the drain 228 of the first transistor 206 is pulled low whenever the voltage at the gate 224 is greater than the first switching voltage threshold (Vgs threshold), the switching voltage threshold determines the minimum voltage of the data that can be transmitted and received by the two wire device through the pull up action of the fourth resistor 216 or by the GPIO port 236 when set to the output mode. The first resistor 208 provides positive bias for the reception port of the two wire device 202 and has a resistance value such that speed of the rising edge of a high bit on the reception port 112 is compatible with the baud rate of the data. The selection of the resistance value of the first resistor 208 is also based on the expected current consumption when the transmission conductor 110 is low, the second transistor 210 is off and the first transistor 206 in on. The first resistor 208 has a resistance of 100K Ohms in the exemplary embodiment.

If the GPIO port 236 on the single wire device is set to a logic "low" and the transmission conductor 110 is "low", the single conductor 114 does not reach a logic high value and remains low since the fourth resistor 216 is grounded by the GPIO port 236. If the GPIO port 236 is set to a high logic voltage and the transmission conductor 110 is set high by the master processor, the single conductor bus 106 remains at a high level. During this state, the second transistor 210 is on and current flows through the second resistor 212. Since the GPIO port 236 is set at or near the second supply voltage 108, however, the voltage on the single conductor bus 106 remains at logic high. As explained above, the single wire device 204 transmits and receives inverse polarity data in the exemplary embodiment.

If the two wire device 202 is turned off, the third resistor 214 pulls the voltage down such that the voltage on the transmission conductor 110 will not exceed the second switching voltage threshold of the second transistor, the potential of the single conductor bus 106 will rise to the second supply voltage, and only a relatively small current will be supplied through the fifth resistor 218 from the second supply.

The fifth resistor 218 provides a pull down resistance when the single wire device 204 and the second supply 108 are disconnected from the single conductor bus 106. The fifth resistor is a 1 M Ohm in the exemplary embodiment and is selected in accordance with a selection criteria that the resistance of the fifth resistor 218 provide only a negligible division with the fourth resistor 216. When the single wire device 204 and the fourth resistor 216 are disconnected, the two conductor bus 102 reception conductor 112 is disconnected allowing another device to be connected to the two wire device 202 through the two conductor bus 102 providing data transmitted to the single conductor bus 106 that can be ignored by the one wire device 204. The first resistor 208 provides a pull up resistance for the reception conductor 112 providing for faster rise times due to parasitic capacitances on the reception conductor 112 which increases its immunity to noise coupled from other conductors or energy sources.

The two wire device 202 may detect the presence of the single wire device 204 using any of several techniques. Since internal or external circuitry of the single wire device 204 includes the fourth resistor 216 in the exemplary embodiment, the two wire device 202 may detect that the single wire device 202 is not connected when data transmitted on the transmission conductor 110 is not received on the reception conductor 112 and the reception conductor 112 remains at a high logic level. The gate 224 of the first transistor 206 remains low since there is no pull up resistor.

When a device connected to the single conductor bus 106 includes the fourth resistor 216 but the two wire device 202 does not receive a response to a transmitted command, the two wire device 202 determines that the single wire device 204 is not connected. This situation may arise were a device includes the resistor 216 but does not have a processor, for example.

When the single wire device 204 is connected or disconnected while the two wire device 202 is operating, the two wire device 202 detects voltage transitions on the reception conductor 212. When the single wire device 204 is connected and the transmission conductor 110 is low, the single conductor bus 106 transitions from a low to a high and the reception conductor 212 transitions from a high to a low. During connection, the fourth resistor 216 raises the voltage from the previously low voltage resulting for the fifth resistor 218 acting as a pull down. When the single wire device 204 is disconnected, the two wire device 202 detects a transition from a low to a high on the reception conductor 112.

By connecting the source 232 of the first transistor 206 to the RX enable port 238 of the two wire device 202, the connection between the reception conductor 112 and the single conductor 114 can be controlled. When the RX enable port 112 output is low, the source 232 is effectively connected to ground and the multiplexing circuit 100 operates as described above. If, however, the RX enable port is set high, the first transistor is effectively turned off since no current flows regardless of the voltage at the gate 224. Such control allows communication with other devices connected to the two conductor bus 102 as described above.

Therefore, the exemplary switching circuits provide an interface between a standard UART 220 and a single conductor bidirectional bus 106. A two wire device 202 of a master device can use a standard two wire RS 232 serial interface to communicate with a single wire device 204 of a slave device. Current consumption of the single wire device 204 is minimized when the two wire device 202 is disabled or powered off. Processing overhead is minimized when the two wire device 202 communicates with single wire devices 204 through a single conductor bus 106 because flow control issues are minimized by providing a command-response transaction sequence and eliminating critical timing requirements. Many applications utilizing the level shifting multiplexing circuit 100 will result in lower cost as result of limiting the interface to the peripheral or slave devices to a single pin. Further, electrostatic discharge issues are more easily managed with a single pin. The exemplary circuit 100 allows the two wire device 202 to detect the presence of the single wire device 204. In addition, a second RS 232 device can be connected to the two conductor bus 102 when the slave devices are removed.

Clearly, other embodiments and modifications of this invention will occur readily to those of ordinary skill in the art in view of these teachings. The above description is illustrative and not restrictive. This invention is to be limited only by the following claims, which include all such embodiments and modifications when viewed in conjunction with the above specification and accompanying drawings. The scope of the invention should, therefore, be determined not with reference to the above description, but instead should be determined with reference to the appended claims along with their full scope of equivalents.

What is claimed is:

1. A level shifting multiplexing circuit for connecting a two conductor full duplex bus referenced to a first voltage supply to a single conductor bidirectional half duplex bus referenced to a second voltage supply, the circuit comprising:
a first switching circuit configured to connect between a reception conductor of a two conductor full duplex bus and a single conductor bidirectional bus and having a first switching voltage threshold resulting in a low logic level at the reception conductor when a voltage at a first gate connected to the single conductor bus exceeds the first switching voltage threshold;
a second switching circuit configured to connect between a transmission conductor of the two conductor full duplex bus and the single conductor bidirectional bus, the second switching circuit configured to present at the first gate:
a high voltage exceeding the first switching voltage threshold of the first switching circuit when a transmission conductor voltage on the transmission conductor is less than a second switching voltage threshold of the second switching circuit, unless a low logic signal is received on the single conductor bus; and
a low voltage less than the switching voltage threshold of the first switching circuit when the transmission conductor voltage is greater than the second switching voltage threshold, unless a high logic signal is received on the single conductor bus.

2. The circuit of claim 1, wherein the first switching circuit comprises:
a first transistor having a first source connected to ground, the first gate connected to the single conductor bus, and a first drain;
a first resistor connected between the first drain and a voltage supply; and
wherein the second switching circuit comprises:
a second transistor having a second source connected to ground, a second gate connected to the transmission conductor, and a second drain;
a second resistor connected between the second drain and the first gate;
a third resistor connected between the second gate and ground; and
a fourth resistor connected between the second voltage supply and the single conductor bus.

3. The circuit of claim 2, wherein the second switching circuit comprises a fifth resistor connected between the single conductor bus and ground.

4. The circuit of claim 2, wherein a voltage divider formed by the fourth resistor and the second resistor results in a first gate voltage less than the first switching voltage threshold when a high logic level is presented at the second control input, unless a high logic signal is received on the single conductor bus.

5. The circuit of claim 4, wherein the first gate voltage is greater than the first switching voltage threshold when the high logic signal is received on the single conductor bus.

6. The circuit of claim 2, wherein:
the first transistor is a first field effect transistor (FET) and the first gate is a first gate of the first FET, the first drain is a first drain of the first FET, and the first source is a first source of the first FET; and
the second transistor is a second FET, and the second gate is a second gate of the second FET, the second drain is a second drain of the second FET, and the second source is a second source of the second FET.

7. The circuit of claim 6, wherein the first transistor and the second transistor are N-Channel metal oxide semiconductor field effect transistors (MOSFETs).

8. A circuit for connecting a two conductor full duplex bus referenced to a first supply voltage to a single conductor bidirectional half duplex bus referenced to a second supply voltage:
a first field effect transistor (FET) having a first drain connected through a first resistor to the first supply voltage, a first source connected to ground, and a first gate configured to connect to the single conductor bidirectional half duplex bus, the first drain configured to connect to a reception conductor of the two conductor full duplex bus; and
a second FET having a second drain connected through a second resistor to the first gate, a second source connected to ground, and a second gate configured to connect to a transmission conductor of the two conductor full duplex bus.

9. The circuit of claim 8, wherein the single conductor bidirectional half duplex bus comprises a pull up resistor connected from the second supply voltage to the single conductor bidirectional half duplex bus.

10. The circuit of claim 9, wherein the second resistor has a resistance less than a pull up resistor resistance.

11. The circuit of claim 10, wherein the resistance of the second resistor is one tenth of the pull up resistor resistance.

12. The circuit of claim 9, further comprising:
a third resistor connected from the second gate to ground.

13. The circuit of claim 12, further comprising:
a pull down resistor connected from the single conductor bidirectional half duplex bus to ground.

14. The circuit of claim 13, wherein the pull down resistor has a pull down resistance at least thirty times a pull up resistance of the pull up resistor.

15. The circuit of claim 13, wherein the first FET has a first gate to source voltage threshold (first Vgs threshold) and the second FET has a second gate to source voltage threshold (second Vgs threshold), the second FET, wherein a ratio of the second resistor resistance to the pull up resistor resistance results a first gate voltage that exceeds the first Vgs threshold when a second gate voltage of the second FET is less than the second Vgs threshold, unless a device connected to the single conductor bidirectional half duplex bus transmits a low logic level.

16. The circuit of claim 13, wherein the first FET has a first gate to source voltage threshold (first Vgs threshold) and the second FET has a second gate to source voltage threshold (second Vgs threshold), the second FET, wherein a ratio of the pull down resistance to the pull up resistance results in a first gate voltage that is less than the first Vgs threshold when a second gate voltage of the second FET is less than the second Vgs threshold, unless a device connected to the single conductor bidirectional half duplex bus transmits a low logic level.

17. The circuit of claim 16, wherein the ratio results in first gate voltage less than the first Vgs threshold when the second gate voltage is greater than the second Vgs threshold, unless the device connected to the single conductor bidirectional half duplex bus transmits a high logic level.

18. A level shifting multiplexing circuit for connecting a two conductor full duplex bus referenced to a first voltage supply to a single conductor bidirectional half duplex bus referenced to a second voltage supply, the circuit comprising:

a first switching means for switching a low logic level to a reception conductor of the two conductor full duplex bus when a first switching voltage threshold is exceeded on the single conductor bidirectional bus and switching a high logic level when the first voltage threshold is not exceeded on the single conductor bidirectional bus;

a second switching means for switching a low voltage and high voltage relative to the first switching voltage threshold to the single conductor bidirectional bus based on a transmission conductor voltage of the two conductor full duplex bus and logic level transmitted by a device connected to the single conductor bidirectional bus.

19. The circuit of claim 18, wherein the second switching means is for:

switching the high voltage exceeding the first switching voltage threshold of the first switching circuit when the transmission conductor voltage on the transmission conductor is less than a second switching voltage threshold of the second switching circuit, unless a low logic signal is received on the single conductor bus; and switching the low voltage less than the switching voltage threshold of the first switching circuit when the transmission conductor voltage is greater than the second switching voltage threshold, unless a high logic signal is received on the single conductor bus.

* * * * *